United States Patent [19]

Shih et al.

[11] Patent Number: 5,654,234
[45] Date of Patent: Aug. 5, 1997

[54] METHOD FOR FORMING A VOID-FREE TUNGSTEN-PLUG CONTACT IN THE PRESENCE OF A CONTACT OPENING OVERHANG

[75] Inventors: Tsu Shih, Chanwa; Chen-Hua Douglas Yu, Hsin-Chu, both of Taiwan

[73] Assignee: Taiwan Semiconductor Manufacturing Company, Ltd., Hsinchu, Taiwan

[21] Appl. No.: 638,674

[22] Filed: Apr. 29, 1996

[51] Int. Cl.$^6$ .................................. H01L 21/283
[52] U.S. Cl. .................. 438/643; 438/645; 438/672; 438/648; 438/712
[58] Field of Search .................... 437/189, 190, 437/192, 195, 228; 257/751, 752, 763

[56] References Cited

U.S. PATENT DOCUMENTS

| | | | |
|---|---|---|---|
| 4,960,732 | 10/1990 | Dixit et al. | 437/192 |
| 5,254,498 | 10/1993 | Sumi | 437/190 |
| 5,290,734 | 3/1994 | Boardman et al. | 437/195 |
| 5,312,773 | 5/1994 | Nagashima | 437/190 |
| 5,403,779 | 4/1995 | Joshi et al. | 437/190 |
| 5,462,895 | 10/1995 | Chen | 437/200 |

FOREIGN PATENT DOCUMENTS

| | | | |
|---|---|---|---|
| 63-77117 | 4/1988 | Japan | 437/190 |
| 2-134847 | 5/1990 | Japan | 437/190 |
| 6-45281 | 2/1994 | Japan | 437/190 |
| 6-45278 | 2/1994 | Japan | 437/190 |

*Primary Examiner*—T. N. Quach
*Attorney, Agent, or Firm*—George O. Saile

[57] ABSTRACT

A method for the fabrication of an ohmic, low resistance contact to silicon is described using a CVD deposited tungsten plug provided with Ti/TiN barrier metallurgy. The method provides for a glass insulator layer deposited on the silicon. After the glass is flowed to planarize its surface, contact holes are patterned in the glass exposing the silicon substrate. The Ti/TiN barrier metallurgy is deposited by sputtering which, because of inferior edge coverage, results in a sidewall with a negative taper. Subsequent deposition of the tungsten results in a tungsten plug with an exposed void. The method taught by this invention deposits first a thin layer of tungsten whose thickness is governed by the amount of overhang caused by the tapered sidewall. An anisotropic dry etch step is then performed to achieve a vertical sidewall of tungsten. The remaining tungsten is then deposited to fill the contact opening without the occurrence of voids.

26 Claims, 5 Drawing Sheets

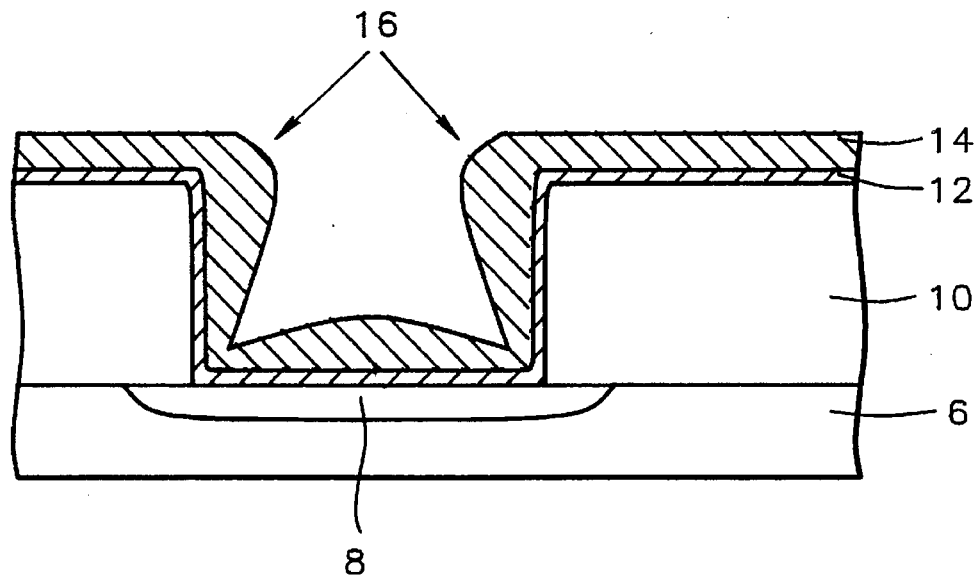
FIG. 1A – Prior Art
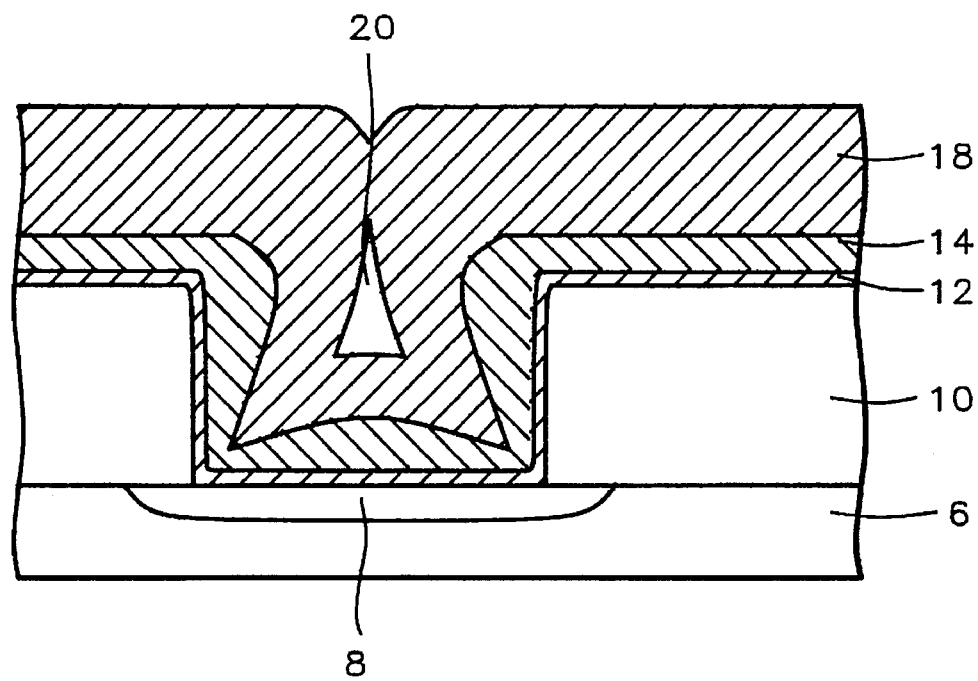
FIG. 1B – Prior Art

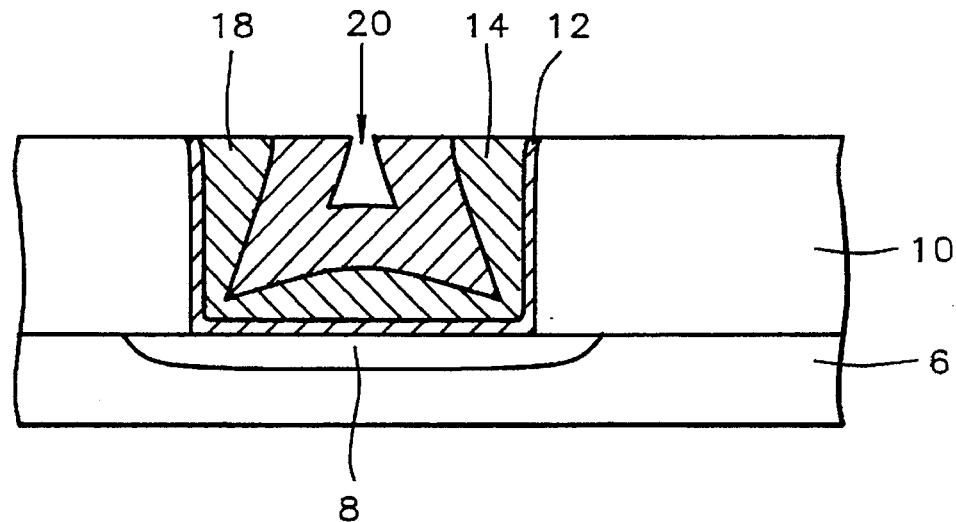
FIG. 1C – Prior Art
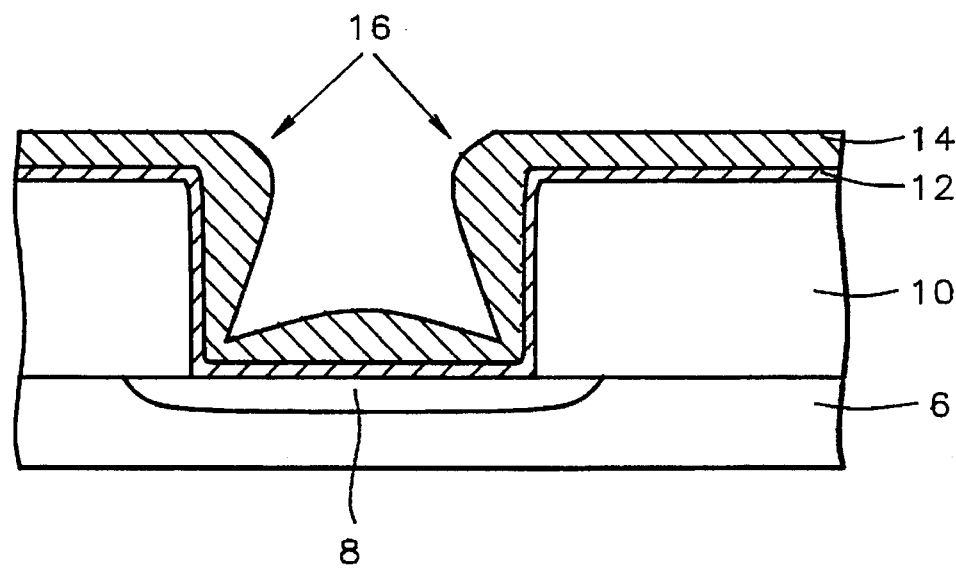
FIG. 2A

METHOD FOR FORMING A VOID-FREE TUNGSTEN-PLUG CONTACT IN THE PRESENCE OF A CONTACT OPENING OVERHANG

BACKGROUND OF THE INVENTION (1) Field of the Invention

The invention relates to processes for the manufacture of semiconductor devices and more particularly to processes for forming metal-to-silicon contacts.

(2) Description of prior art

The use of tungsten in the fabricating of very-large-scale integrated(VLSI) circuits has been in vogue since the mid 1980s. As a conductive material tungsten does not rank as high as aluminum, which has been the primary conductor used in micro-circuit chip technology for nearly forty years. On the other hand, tungsten provides many features which make it an important material for fabricating metal-to-silicon contacts. In this capacity tungsten is deposited into contact openings, vertically etched into an insulating layer covering the silicon. These contact openings expose active areas of the subjacent semiconductor devices. The tungsten plugs are then connected to aluminum alloy conductors at the upper surface of the insulating layer. The short length of conductive path thus provided by the tungsten plug has no significant impact on the conductivity of the overall interconnect line.

Chemical vapor deposited(CVD) tungsten has proven to be an excellent material for such interconnect applications because of its low resistance, low stress(less than $5 \times 10^9$ dynes/cm$^2$), and a coefficient of thermal expansion which closely matches that of silicon. In addition tungsten has a high resistance to electromigration which is a common problem with aluminum its alloys. CVD tungsten can be deposited at temperatures around 400° C. with good conformity and step coverage.

Although tungsten does not bond well to either silicon or the adjacent silica based insulating layer, a thin layer(less than 1,000 Angstroms) of titanium(Ti) is often used as a bonding agent to the silicon. Dixit et.al. U.S. Pat. No. 4,960,732 describe the formation of a tungsten plug contact utilizing Ti as a bonding agent followed by a layer of titanium nitride(TiN) which acts as a diffusion barrier to prevent dopants from passing from the silicon as well as spiking of metal into the Silicon. The Ti layer, when thermally annealed fuses with the silicon to form titanium silicide(TiSi$_2$) and with the silica based insulating layer to form a titanium silicate(Ti$_x$SiO$_y$). Adhesion of the TiN to the Ti and subsequently the tungsten to the TiN is considered excellent.

The Ti—TiN—W composite tungsten plug metallurgy has been widely accepted and various techniques for its formation have been described. In the earliest teachings such as those of Dixit et.al., the Ti an TiN layers were deposited by sputtering although CVD is also claimed. The sputtering can be accomplished by first sputtering a titanium target with argon to form the Ti layer and then admitting nitrogen, thereby sputtering reactively, to form the TiN layer. Alternatively, a multi-target sputtering tool can be used having a Ti target and a TiN target so that the layers may be deposited during a single evacuation cycle by switching targets within the tool. Successive deposition of the Ti and the TiN layers during a single pumpdown is important because exposure of the Ti layer to atmosphere will immediately result in the formation of a native oxide layer which can compromise the resistivity of the contact if not removed prior to the deposition of the TiN.

The good conformity and step coverage afforded by tungsten is due in large part to the nature of the deposition process itself. In the CVD process, particularly with low pressure chemical vapor deposition(LPCVD), the chemical reaction which forms the product occurs at the heated surface of the material receiving the deposition. Physical vapor deposition(PVD) processes such as evaporation or sputtering, cannot provide such good conformity and edge coverage because the material being deposited arrives from regions distant from its final location. This lends directionality to the process and consequently those regions of a receiving substrate which face the source of the particle stream receive the greater amount of deposit than those topological features not normal to the particle stream. Step coverage can be improved to some extent by heating of the substrate wafer. This allows some degree of surface migration of the depositing species to occur, thereby improving conformity.

Consequently the sputtering processes for the deposition of Ti and TiN have the shortcoming of poor step coverage. This is illustrated in a prior art cross section shown in FIG. 1A. A semiconductor wafer 6, having an active area diffusion 8 has an insulating layer 10 into which a contact opening has been made and a thin layer of Ti 12 followed by a thicker layer of TiN 14 have been deposited by sputtering. Inadequate step coverage causes the negatively tapered overhang of TiN 16. The subsequently deposited tungsten layer then prematurely pinches off before the bottom of the opening is filled. The result is a void 20 shown in FIG. 1B. When the tungsten layer is etched back to the insulating layer 10(FIG. 1C) or to the TiN layer 14, the void 20 is exposed creating a potential reliability defect.

Chen U.S. Pat. No. 5,462,895 also points out this step coverage shortcoming but does not indicate the occurrence of voids in the tungsten. However, such voids have been observed by scanning electron microscopy(SEM). Further, the occurrence of exposure of these voids after tungsten etchback can be clearly seen by SEM (See FIG.3A). At this point they are highly susceptible to absorption of moisture or other corrosive contaminants.

Chen resolved the edge coverage problem by using CVD for the deposition of the Ti and TiN layers, thereby achieving better conformity. However, because of thermal budget restraints and other processing impediments, CVD is not always a viable option. In addition, even CVD step coverage is inadequate to avert voids where high aspect ratio openings are encountered.

Nagashima U.S. Pat. No. 5,312,773 forms a tungsten plug as an interlevel connection structure. However, he covers a TiN layer along the walls with a silicon oxide layer and utilizes selective tungsten deposition whereby the tungsten does not deposit on the silicon oxide wall but grows upward from the bottom of the opening. The base of the opening is not a device active area but a polysilicon layer which has no Ti or TiN over it.

SUMMARY OF THE INVENTION

Accordingly, it is the purpose of this invention to provide a method for forming void-free tungsten plug contacts within openings having an Ti—TiN metallurgy deposited by sputtering. The method utilizes a two-step tungsten deposition and an anisotropic etch. After the Ti and TiN layers are deposited, a thin conformal layer of LPCVD tungsten is deposited such that the thickness of this layer is approximately equal to the overhang distance of the Ti—TiN composite layer. Next an anisotropic dry etch, preferably reactive ion etching(RIE), is performed with end-point-detect to remove the tungsten normal to the surface plane of the wafer. Tungsten sidewalls remain within the contact opening which fill the area beneath the overhang. A second LPCVD tungsten deposition completes the filling of the now vertical-walled contact opening. The tungsten is then etched back to the insulating glass layer or to the TiN layer by RIE leaving void-free tungsten plugs.

BRIEF DESCRIPTION OF THE DRAWINGS

FIGS. 1A–1C show the steps of a prior art process for forming a W-plug contact.

FIGS. 2A–2E show the steps of the contact forming process taught by this invention.

DESCRIPTION OF THE PREFERRED EMBODIMENTS

Referring now to FIG. 2A, a p-doped <100> oriented monocrystalline silicon wafer 6 is provided. Using standard processing techniques familiar to those in the integrated circuit manufacturing industry, semiconductor devices such as self-aligned polysilicon gate field effect transistors, are formed within the surface of the silicon wafer. The heavily doped source and drain implants of arsenic or phosphorous 8 comprise the active areas of these devices to which metallic contacts are to be formed.

At the point of insertion of this invention a layer of borophosphosilicate glass(BPSG) 10 between 5,000 and 15,000 Angstroms thick has been deposited onto the silicon surface and contact openings have been patterned and etched into it by RIE. A layer of Ti 12 between 400 and 600 Angstroms thick and a layer of TiN 14 between 800 and 1,200 Angstroms thick have been deposited over the wafer by dc sputtering. The method of sputtering can be either from a single titanium target utilizing argon to first sputter the Ti layer 12 and then admitting nitrogen to reactively sputter the TiN layer 14 or by utilizing a multi-target sputtering tool having a Ti target and a TiN target. The two layers are deposited sequentially without breaking vacuum.

Figure 2B:
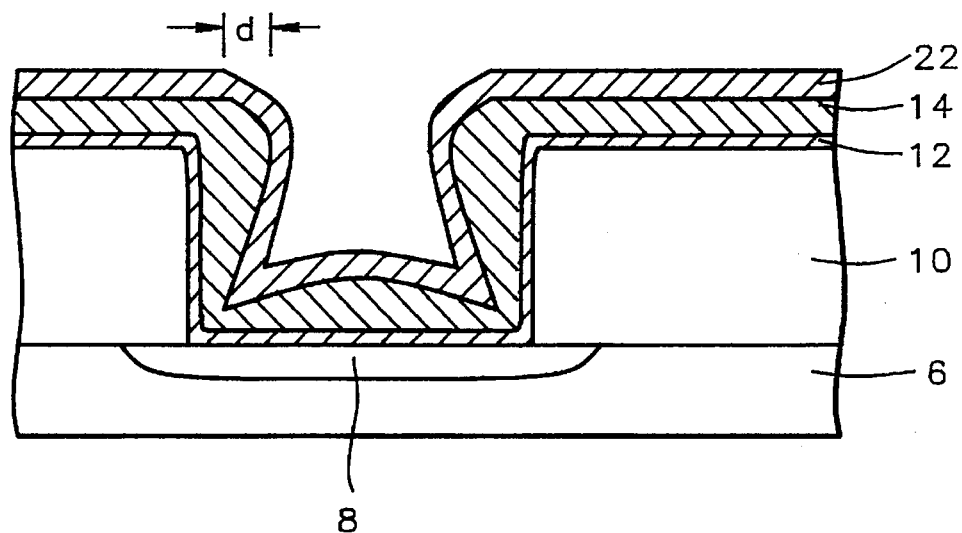

The wafer is then exposed to a rapid thermal annealing cycle creating temperatures from 900° to 1000° C. During this period which normally lasts for about 20 seconds, the titanium layer reacts with the silicon to form $TiSi_2$ and at the same time also forms an intimate chemical bond with the BPSG by forming titanium silicate. Implanted dopant atoms in the silicon are electrically activated during this step. Referring now to FIG. 2B, a layer of tungsten 22 is deposited over the wafer by LPCVD at a temperature of between 440° C. and 475° C. using tungsten hexafluoride($WF_6$) and hydrogen. The deposition is carried out in a cold-walled, low temperature LPCVD reactor. The thickness of this layer is determined to be at least equal to the degree of overhang of the Ti—TiN layer. This is represented by the distance d in FIG. 2B.

The layer 22 is then etched back to the TiN/W interface by RIE using $SF_6$ as the etchant gas. The flow rates, gas pressures, and tool operating parameters are adjusted to provide a high etch rate selectivity of W to TiN. The methods for controlling the etching selectivity during RIE are well known to those skilled in the art. The detection of endpoint is accomplished by observing an increase in the fluoride signal at 703nm.

Figure 2C:
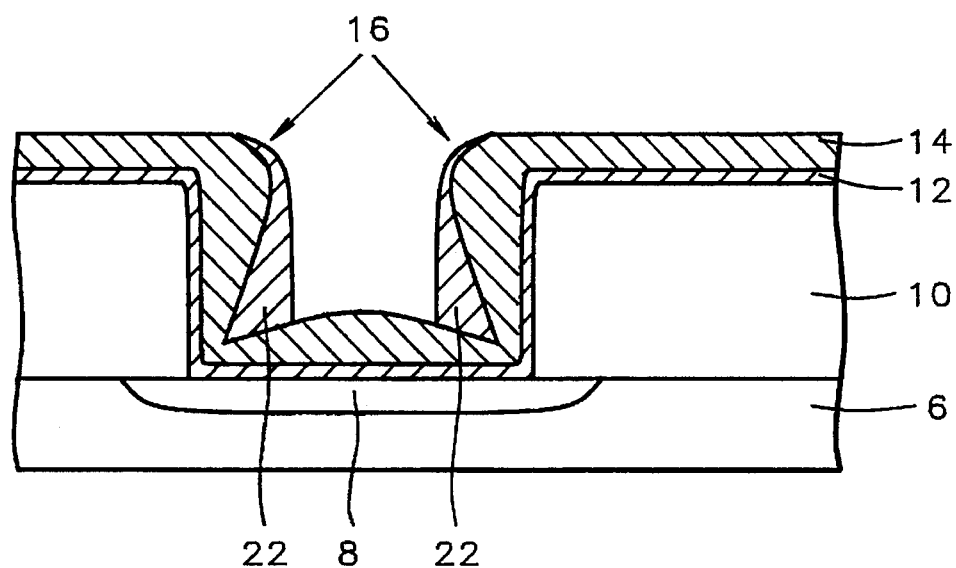

After the etchback, the profile of the contact opening is represented by FIG.2C. Because of the controlled anisotropy of the RIE, the remnants of the tungsten layer 22 provide vertical sidewalls within the contact openings, filling in the region below the overhang 16.

Figure 2D:
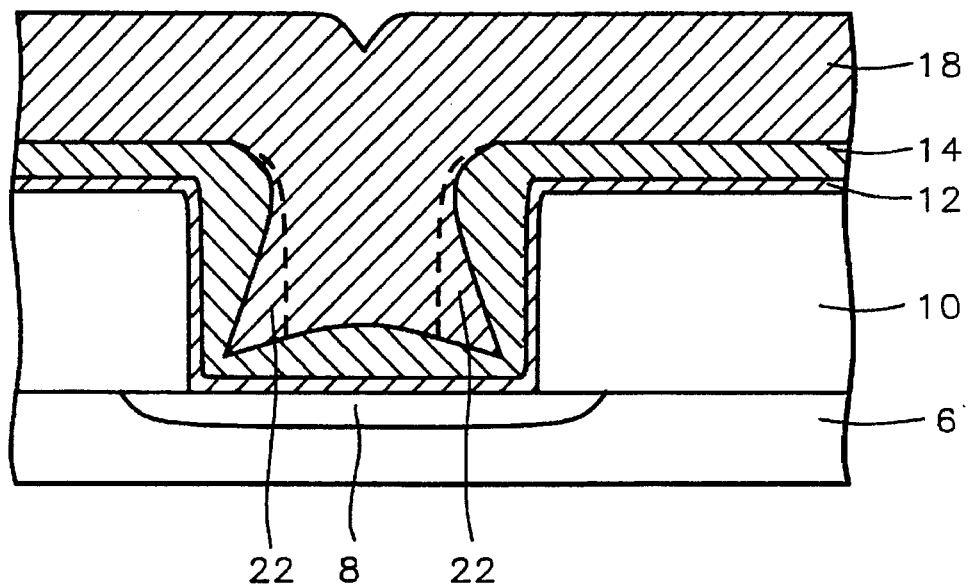

A second layer tungsten 18(FIG. 2D) nominally 4,000 to 6,000 Angstroms thick is then deposited by LPCVD between 440° C. and 475° C. to complete the filling of the contact opening.

Figure 2E:
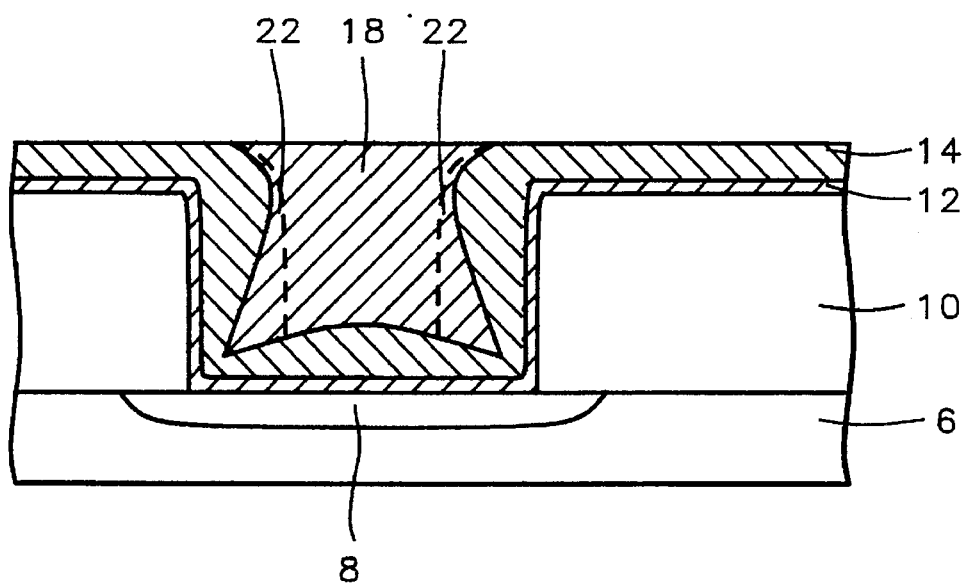

Because the walls of the contact openings are rendered vertical by the tungsten sidewalls, the filling by the second tungsten deposition is complete and the plug is without voids. The tungsten layer 18 is patterned with photoresist and etched back to the glass layer 10 to define the completed tungsten plugs as shown in cross section in FIG.2E.

Figure 3A:
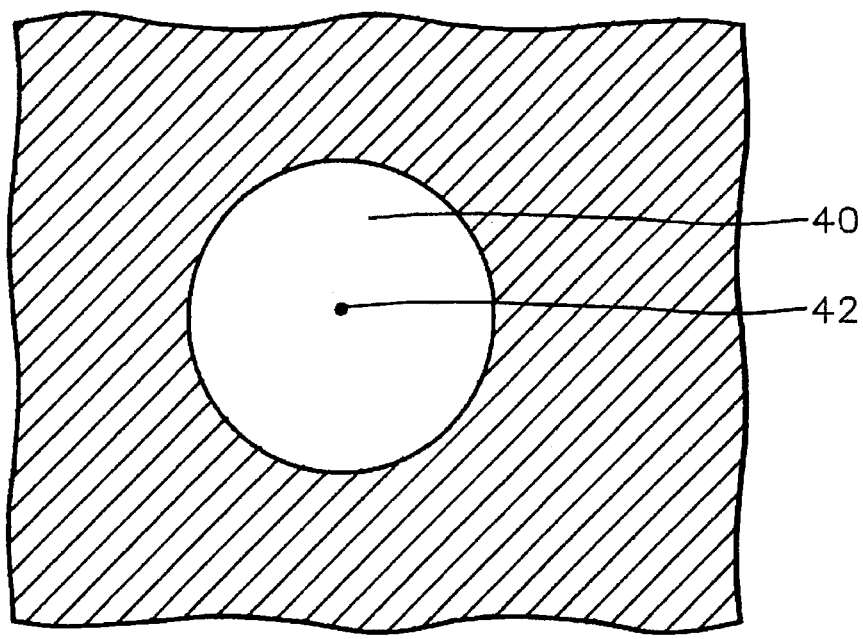
FIG. 3A–3B) are representations of SEM photographs of the top surface of tungsten plugs before and after the application of this invention.
Figure 3B:
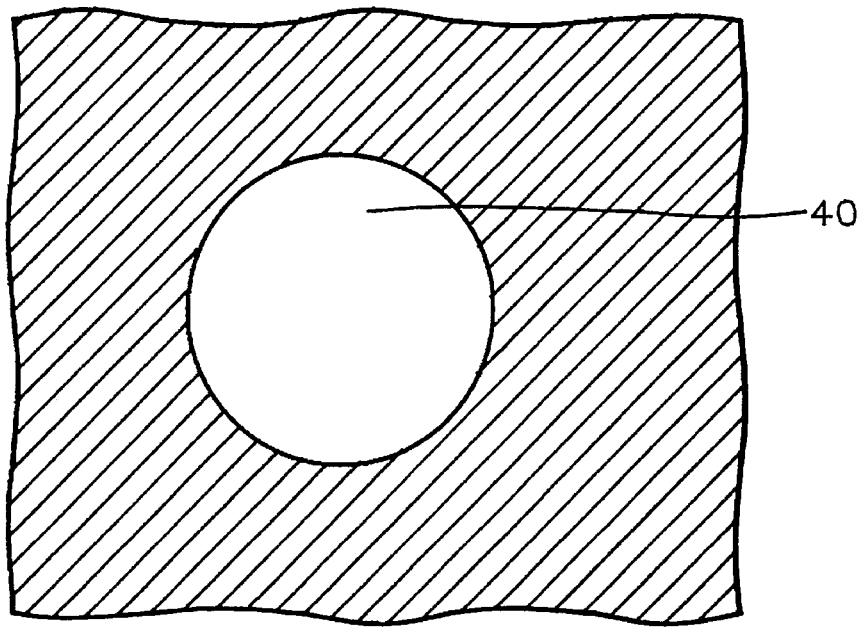

FIG. 3A is a representation of an SEM photograph of the top surface of a W-plug 40 made with the prior art process of FIG. 1A–1E. The dark spot 42 at the center is a void which has been exposed after the W etchback (shown in cross section in FIG.1C-20). FIG. 3B is a comparable view of a W-plug made with the procedure of this invention. Both top and cross-sectional(not shown) SEM photographs show no evidence of voids within the W-plug.

The W-plugs are subsequently contacted by the preferred interconnection metallurgy, which typically consists of an aluminum alloy, deposited and patterned on the surface of the insulating layer.

The embodiment of FIG.2 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method of forming void-free tungsten plug contacts which provide connection of semiconductor devices to a metallic interconnection network of an integrated circuit comprising:

providing a semiconductor substrate having semiconductor devices formed within its surface;

forming a layer of silicate glass over said semiconductor substrate; patterning and etching said silicate glass to form vertical contact openings, thereby exposing subjacent active areas of said semiconductor devices;

forming a titanium layer over said silicate glass;

forming a barrier layer over said titanium layer;

subjecting said semiconductor substrate to rapid thermal annealing;

depositing a first tungsten layer over said titanium layer;

etching said first tungsten layer with a unidirectional dry etching technique;

depositing a second tungsten layer over said semiconductor substrate; and etching said second tungsten layer with a unidirectional dry etching technique to form tungsten plugs; and affixing a metallic interconnection network to said tungsten plugs to complete the formation of integrated circuit chips.

2. The method of claim 1 wherein the silicate glass is borophosphosilicate glass(BPSG) of approximately 5,000 to 15,000 Angstroms thickness.

3. The method of claim 1 wherein the silicate glass is phosphosilicate glass(PSG) of approximately 5,000 to 15,000 Angstroms thickness.

4. The method of claim 1 wherein the titanium layer is deposited by sputtering.

5. The method of claim 1 wherein the titanium layer is between 400 and 600 Angstroms thick.

6. The method of claim 1 wherein the barrier layer is titanium nitride(TiN) and is between 800 and 1,200 Angstroms thick.

7. The method of claim 1 wherein the barrier layer is a titanium tungsten alloy (TiW) and is between 800 and 1,500 Angstroms thick.

8. The method of claim 1 wherein the barrier layer is deposited by sputtering.

9. The method of claim 1 wherein the rapid thermal annealing is accomplished in nitrogen using a halogen lamp as a heat source.

10. The method of claim 1 wherein the temperature of the wafer surface during the rapid thermal annealing is between 900° C. and 1000° C.

11. The method of claim 1 wherein the first tungsten layer is deposited at a temperature between 440° C. to 475° C. in a cold walled, low temperature CVD system by the reduction of $WF_6$ with hydrogen.

12. The method of claim 1 wherein the thickness of the first tungsten layer is approximately equal to the lateral distance of overhang of the barrier layer.

13. The method of claim 1 wherein the unidirectional etching technique is reactive ion etching using an etchant gas containing $SF_6$, $N_2$, Ar, and He with parametric conditions to provide vertical sidewalls, and a means of end-point control.

14. A method of forming void-free tungsten plug contacts to a silicon wafer comprising:

providing a silicon wafer having a layer of silicate glass with vertical contact openings patterned and etched in it, exposing subjacent contact regions of said silicon wafer;

forming a titanium layer over said silicate glass;

forming a barrier layer over said titanium layer;

subjecting said semiconductor substrate to rapid thermal annealing;

depositing a first tungsten layer over said titanium layer;

etching said first tungsten layer with a unidirectional dry etching technique;

depositing a second tungsten layer over said semiconductor substrate; and etching said second tungsten layer with a unidirectional dry etching technique to form tungsten plugs.

15. The method of claim 14 wherein the silicate glass is borophosphosilicate glass(BPSG) of approximately 5,000 to 15,000 Angstroms thickness.

16. The method of claim 14 wherein the silicate glass is phosphosilicate glass(PSG) of approximately 5,000 to 15,000 Angstroms thickness.

17. The method of claim 14 wherein the titanium layer is deposited by sputtering.

18. The method of claim 14 wherein the titanium layer is between 400 and 600 Angstroms thick.

19. The method of claim 14 wherein the barrier layer is titanium nitride(TiN) and is between 800 and 1,200 Angstroms thick.

20. The method of claim 14 wherein the barrier layer is a titanium tungsten alloy (TiW) and is between 800 and 1,500 Angstroms thick.

21. The method of claim 14 wherein the barrier layer is deposited by sputtering.

22. The method of claim 14 wherein the rapid thermal annealing is accomplished in nitrogen using a halogen lamp as a heat source.

23. The method of claim 14 wherein the temperature of the wafer surface during the rapid thermal annealing is between 900° C. and 1000° C.

24. The method of claim 14 wherein the first tungsten layer is deposited at a temperature between 415° C. to 500° C. in a cold walled, low temperature CVD system by the reduction of $WF_6$ with hydrogen.

25. The method of claim 14 wherein the thickness of the first tungsten layer is approximately equal to the lateral distance of overhang of the barrier layer.

26. The method of claim 14 wherein the unidirectional etching technique is reactive ion etching using $SF_6$, $N_2$, Ar, and He with parametric conditions to provide vertical sidewalls, and a means of end-point control.

* * * * *